United States Patent
Esposito

(10) Patent No.: US 7,406,134 B1
(45) Date of Patent: Jul. 29, 2008

(54) VERY HIGH DATA RATE UP-CONVERSION IN FPGAS

(75) Inventor: Ben Esposito, Oviedo, FL (US)

(73) Assignee: Altera Corporation, San Jose, CA (US)

( * ) Notice: Subject to any disclaimer, the term of this patent is extended or adjusted under 35 U.S.C. 154(b) by 508 days.

(21) Appl. No.: 10/795,189

(22) Filed: Mar. 4, 2004

(51) Int. Cl.
*H04L 27/20* (2006.01)

(52) U.S. Cl. .................................... 375/308

(58) Field of Classification Search ................ 375/260, 375/269, 273, 279, 280, 281, 282, 283, 295, 375/308; 332/103, 104, 105; 327/233, 238, 327/254
See application file for complete search history.

(56) References Cited

U.S. PATENT DOCUMENTS

| | | | | |
|---|---|---|---|---|
| 5,274,372 A | * | 12/1993 | Luthra et al. | 341/61 |
| 5,815,046 A | * | 9/1998 | Spilker et al. | 332/103 |
| 6,621,366 B1 | * | 9/2003 | Gentile | 332/103 |
| 2001/0022811 A1 | * | 9/2001 | Lillington | 375/229 |
| 2001/0024475 A1 | * | 9/2001 | Kumar | 375/270 |
| 2003/0174784 A1 | * | 9/2003 | Samarasooriya et al. | 375/308 |

* cited by examiner

*Primary Examiner*—Sam K Ahn
(74) *Attorney, Agent, or Firm*—Townsend and Townsend and Crew LLP; J. Matthew Zigmant

(57) ABSTRACT

Methods, circuits, and apparatus for providing an RF up-converter using digital circuits. One exemplary embodiment provides an up-converter that uses multiple channels of parallel digital processing, then serializes individual bits from these channels to achieve higher frequencies. Specifically, I and Q components of a signal to be transmitted are decomposed into multiple components, each phase shifted from another. Quadrature versions of an oscillator signal are similarly decomposed and multiplied with corresponding I and Q signal components. The products are combined and serialized on a bit-by-bit basis to generate an RF signal.

21 Claims, 7 Drawing Sheets

VERY HIGH DATA RATE UP-CONVERSION IN FPGAS

BACKGROUND

The present invention relates generally to high speed digital radio frequency (RF) circuits, and more specifically to digital RF up-converters.

Wireless networks and components have been increasing in popularity at a tremendous rate over the last few years. Networking standards such as Bluetooth and IEEE 802.11 allow a wide array of devices to communicate over the airwaves, and enable connectivity at locations such as Starbucks and airports. Integrated circuits that support these and other standards continue to gain importance.

One traditional or conventional way to manufacture and design these wireless circuits is to use analog techniques. But analog circuits often require expensive external components such as tuning inductors, capacitors, and the like. Also, analog circuits often require exotic or expensive process techniques such as BiCMOS (a bipolar and CMOS combined process), SiGe (silicon substrate with germanium emitters), or other such process. Further, analog devices may require the use of devices such as Zener diodes that require additional mask steps during fabrication. These processes are more expensive than simple CMOS processes, and their use means that the analog portion cannot be integrated on a single substrate with other digital portions such as a digital signal processing circuit (DSP) or modulator-demodulator (modem). However, these analog techniques do provide operation at speeds that conventional CMOS circuits cannot achieve.

One specific circuit that has proved to be difficult to implement in a digital circuit is an RF up-converter. These circuits convert either a baseband or intermediate frequency (IF) signal to an RF signal for transmission. It would be very desirable to implement this circuit in the digital domain. A digital RF up-converter could be integrated on a large digital chip, for example an FPGA, with other digital circuits such as modems, encoders, and DSPs. Also, simple CMOS processing could be used, thus reducing manufacturing costs.

Accordingly, it is very desirable to have circuits, methods, and apparatus for implementing RF up-converters and related circuits, such as numerically controlled oscillators (NCOs), digital circuitry.

SUMMARY

Accordingly, exemplary embodiments of the present invention provide methods, circuits, and apparatus for providing an RF up-converter using digital circuits. One exemplary embodiment provides an up-converter that uses multiple channels of parallel digital processing, then either serializes these channels on a per-bit basis to achieve higher frequencies. Specifically, in phase (I) and quadrature (Q) components of a signal to be transmitted are each decomposed into multiple components. Ssine and cosine (quadrature) versions of an oscillator signal are similarly decomposed, and multiplied with a corresponding I and Q signal component. These channels are then combined and serialized to generate an RF signal. This general principle may be applied to the up-converter itself, or to circuits in the up-converter, such as a numerically controlled oscillator. NCOs consistent with embodiments of the present invention multiplex or serialize phase-shifted sine and cosine signals to generate higher frequency sine and cosine signals. Various embodiments of the present invention may incorporate one or more of these or the other principles described herein.

A better understanding of the nature and advantages of the present invention may be gained with reference to the following detailed description and the accompanying drawings.

DESCRIPTION OF EXEMPLARY EMBODIMENTS

Figure 1:
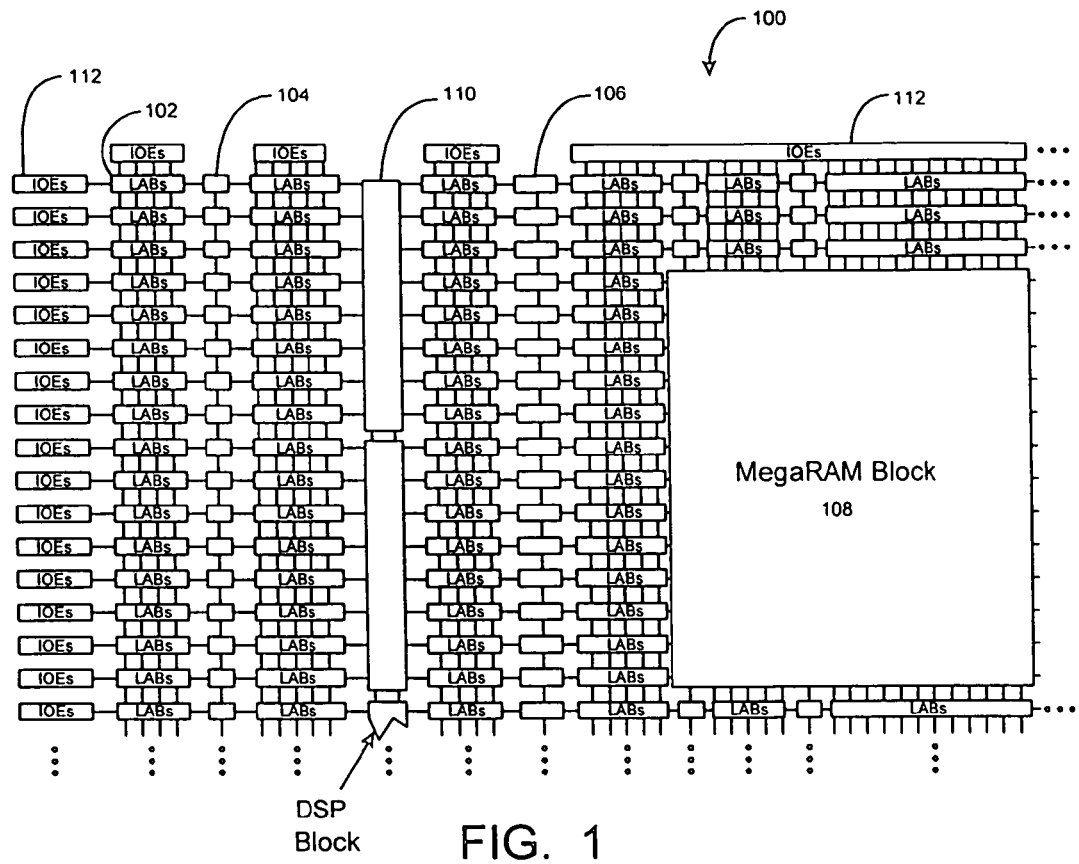
FIG. 1 is a simplified block diagram of a programmable logic device that can implement embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnects of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106 and a M-Block 108 providing 512K bits of RAM. These memory blocks may also include shift registers and FIFO buffers. PLD 100 further includes digital signal processing (DSP) blocks 110 that can implement, for example, multipliers with add or subtract features. I/O elements (IOEs) 112 located, in this example, around the periphery of the device support numerous single-ended and differential I/O standards. It is to be understood that PLD 100 is described herein for illustrative purposes only and that the present invention can be implemented in many different types of PLDs, FPGAs, and the like.

Figure 2:
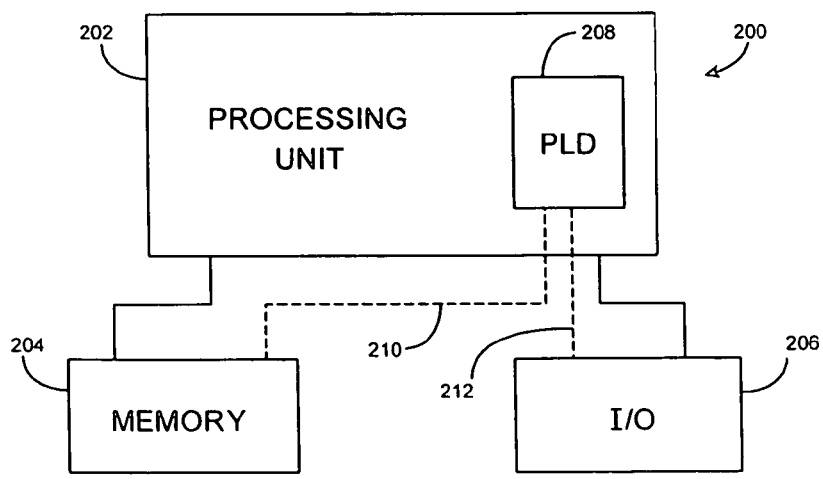
FIG. 2 is a block diagram of an electronic system that may incorporate embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Figure 3:
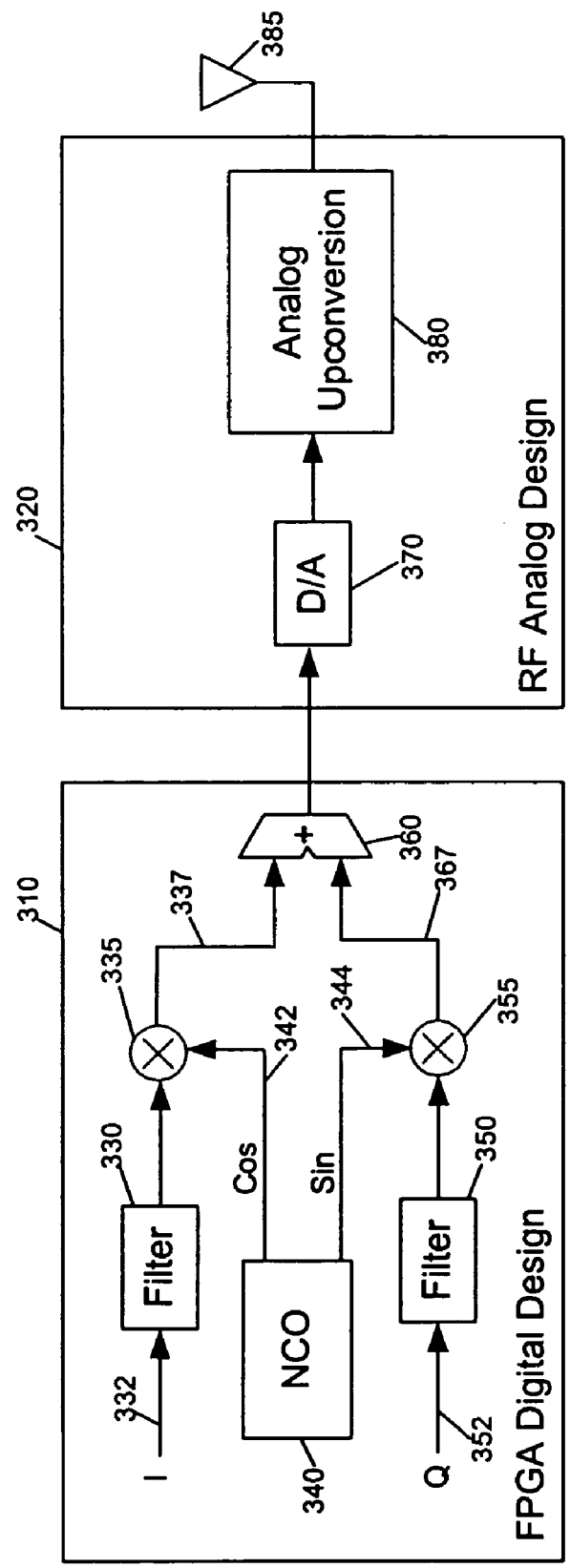
FIG. 3 illustrates a conventional RF modulation system that may be improved by incorporation of embodiments of the present invention.

FIG. 3 illustrates a conventional RF modulation system that may be improved by incorporation of embodiments of the present invention. Included are a digital portion 310 followed by an analog portion 320. The digital portion 310 includes filters 330 and 350, a numerically controlled oscillator (NCO) 340, mixers 335 and 355, and summing junction or adder 360. The analog portion 320 includes digital-to-analog converter 370 followed by an analog up-converter 380. The analog output drives a signal on antenna 385 to a remote receiver.

I and Q portions of the signal to be transmitted are received by the filters 330 and 350 on lines 332 and 352. These signals are filtered by filters 330 and 350, that is, the high frequency components are removed. The numerically controlled oscillator 340 provides sine and cosine signals at an intermediate frequency (IF) on lines 344 and 342. These sine and cosine signals are ideally in quadrature with each other. The filtered I and Q signals are multiplied by these quadrature IF signals by multipliers or mixers 335 and 355. The outputs of mixers 335 and 355 are summed by adder 360.

The output of the adder 360 is received by the digital-to-analog converter 370. The digital-to-analog converter 370 converts the digital signal from the digital circuit 310 to an analog signal and provides it to the analog up-conversion block 380. This circuit mixes this analog signal with a carrier frequency and provides an output at the antenna 385 for transmission to a remote receiver.

The full complexity of the analog section 320 is not shown for simplicity. Typically however, several external components, such as tuning inductors and capacitors are required to implement the filters and other analog circuits. These components should be arranged properly on a printed circuit board along with the digital and analog portions 310 and 320 for optimal operation. This complexity adds cost design time to these circuits, and reduces manufacturability and reliability. Thus, it is highly desirable to eliminate at least most of these external components by replacing the analog up-converter 380 with circuitry in the digital domain.

Figure 4:
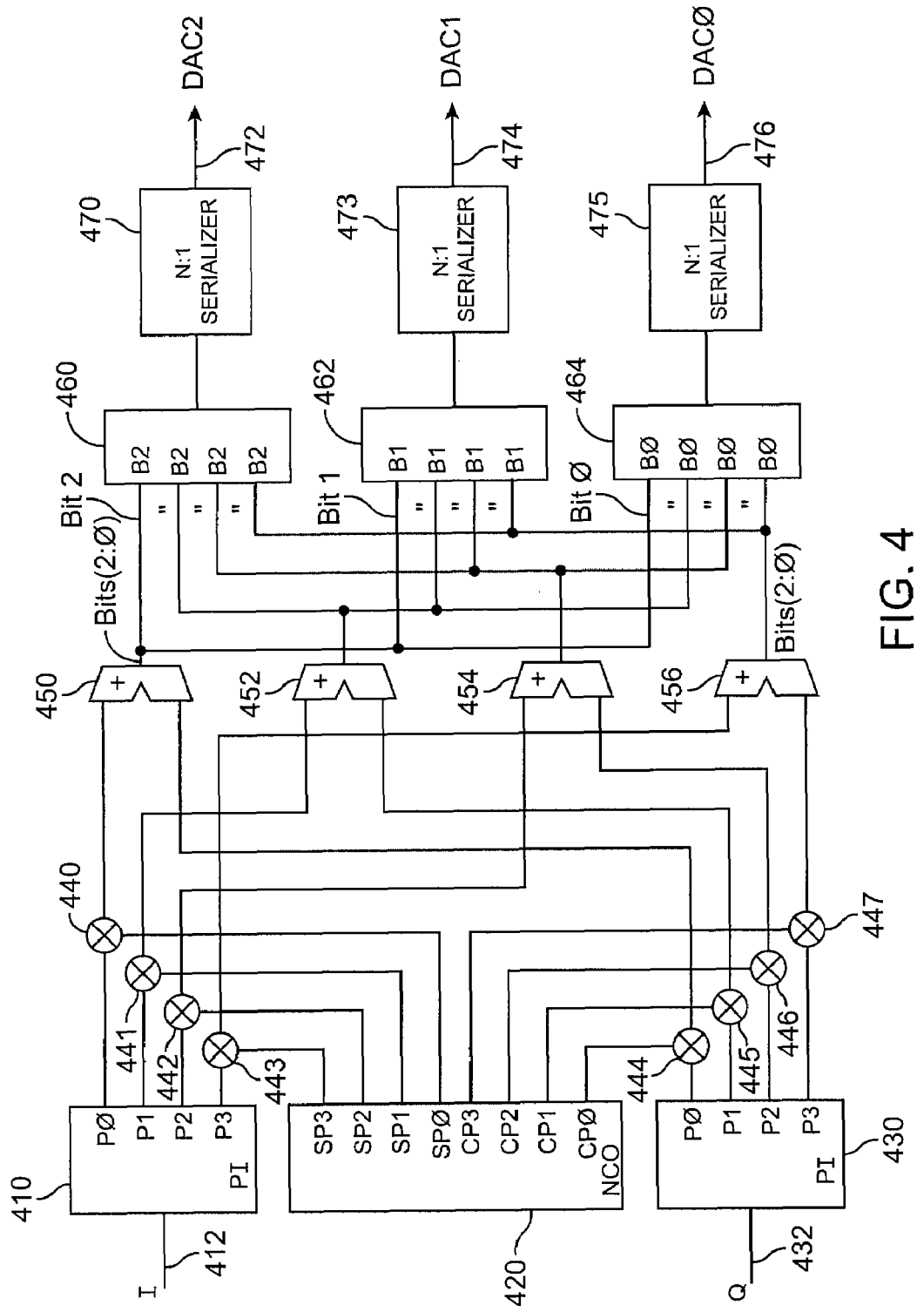
FIG. 4 illustrates a modulation system consistent with an embodiment of the present invention.

FIG. 4 illustrates a modulation system consistent with an embodiment of the present invention. Included are polyphase filters 410 and 430, numerically controlled oscillator 420, mixers 440, 441, 442, 443, 444, 445, 446, and 447, summing nodes 450, 452, 454, and 456, register banks 460, 462, and 464, and serializers 470, 473, and 475. This figure, as with all the included figures, is included for exemplary purposes only, and does not limit either the possible embodiments of the present invention or the claims.

This circuit allows for RF up-conversion to take place in the digital domain. This is done by utilizing parallel resources available on large digital chips, for example FPGAs manufactured by Altera Corporation located in San Jose, Calif. The serializers 470, 473, and 475 convert lower-speed parallel data to higher-speed, RF serial information. In this specific example, N is equal to 4, therefore, circuitry preceding the N:1 serializers operate at one-fourth the frequency as the outputs of the serializers 470, 473 and 475. For example, the mixers, such as mixer 440, and NCO 420, operate at one-fourth of the clock rate that would otherwise be required.

In this specific example, the NCO, and I and Q signals are decomposed into four signals, with each I and Q signal pair separated by 90 degrees. Again, this allows for a reduction in operating frequency for the mixers, NCO, and related circuitry. Further, in this is specific example, each data word is 3 bits wide. Typically however, each data word is wider, for example 8 or 10 bits wide. In this example, a word size of 3 bits was chosen for simplicity. It will be appreciated by one skilled in the art that other numbers of bits per word, and other degrees of decomposition may be used in various embodiments of the present invention. In a specific embodiment of the present invention, each signal is decomposed into 8 signals, that is there are 8 parallel channels, where each channel is 10-bits wide. In that example, the serializer outputs operate at 640 MHz, while the mixers and NCO are only required to operate at 80 MHz. This parallel processing allows for much greater frequencies to be achieved in the digital domain that allowed by conventional digital converters.

Input signals I and Q are received on lines 412 and 432 by the polyphase filters 410 and 430. In a specific embodiment of the present invention, these filters are made up of 8 parallel conventional 10-tap FIR filters. The outputs of NCO 420 provide multiple sine and cosine signals to the mixers. These sine and cosine signals are phased shifted from each other. For example, four sine and four cosine outputs are illustrated here, each output phased shifted from each other. The decomposed I, Q, sine, and cosine signals are multiplied by mixers 440 through 447. The outputs of the mixers 443 through 447 are summed by adders 450, 452, 454, and 456. Specifically, the outputs of mixers that receive quadrature inputs from the NCO are summed together. For example, mixers 440 and 444, which receive sine and cosine signals having 0 phase, are summed together by adder 450.

The outputs of the adders are stored in register banks 460, 462, and 464, on a per-bit basis. Specifically, the MSBS from each of the words out of the adders are stored in register bank 460, while the LSBS are stored in register banks 464. The output of these register banks are serialized by serializers 470, 473, and 475. The serializers receive slower speed data from the register banks in parallel and convert them to higher speed serial data on output lines 472, 474, and 476. The outputs of the serializers typically drive a digital-to-analog converter, not shown. In a specific embodiment, the output of the converter drives a filter, which in turn drives an antenna for transmission to a remote receiver.

It will be appreciated by one skilled in the art that modifications may be made to this circuit without departing from embodiments of the present invention. For example, registers 460 may be incorporated as part of the serializers 470. Alternately, the registers may be retained to aid in the deskewing of the adder outputs.

Figure 5:
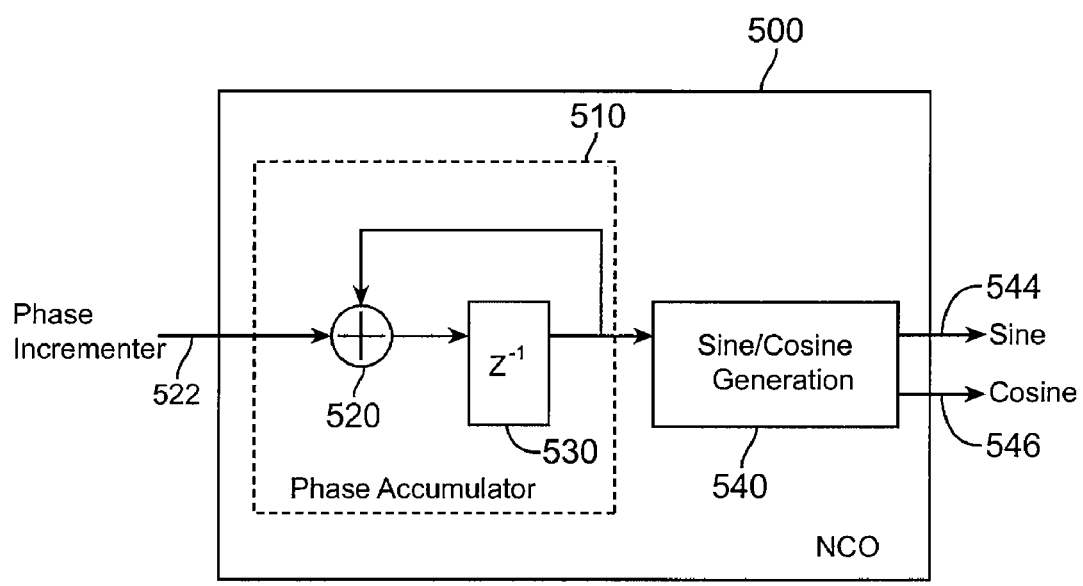
FIG. 5 illustrates an NCO that may benefit by the incorporation of embodiments of the present invention.

FIG. 5 illustrates an NCO 500 that may benefit by the incorporation of embodiments of the present invention. Included are a phase accumulator 510 and a sine and cosine generator 540. The phase accumulator 510 further includes a summing junction 520 and storage register 530.

The NCO receives a phase incrementer signal on line 522. Each clock cycle, the phase accumulator adds the phase incrementer signal on line 522 to a running total. This total is provided to the sine and cosine generation circuits 540. This circuit receives the accumulated phase and reduces it to a value between 0 and $2\pi$ radians by performing a mod $[2\pi]$ function, or by simply dropping values above $2\pi$ and starting the accumulation again, for example, with a counter. The sine and cosine generation circuits 540 typically include lookup tables to translate the reduced phase accumulation value to sine and cosine values that are provided on lines 544 and 546. The operation of this NCO is limited by the clock rate at which the phase may be accumulated and the rate at which the lookup tables in the sine and cosine generation circuit 540 may be accessed.

Figure 6:
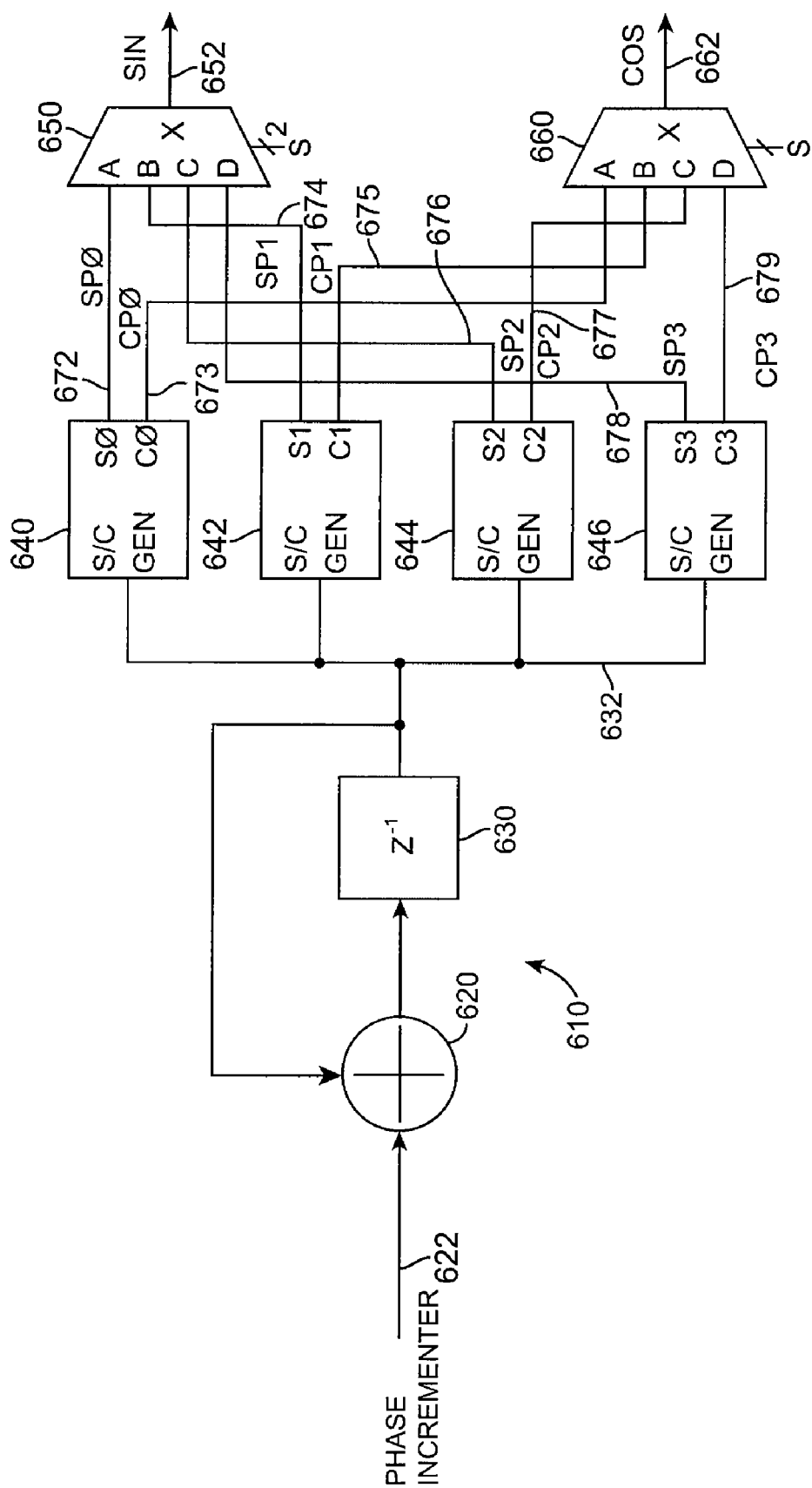
FIG. 6 is a block diagram of an NCO incorporating an embodiment of the present invention.

FIG. 6 is a block diagram of an NCO incorporating an embodiment of the present invention. This NCO includes an adder 620, transformer 630, sine and cosine generators or lookup tables 640, 642, 644, and 646 and multiplexers 650 and 660. This NCO may be used as the NCO 420 in FIG. 4 and similar embodiments of the present invention. When it is used as the NCO 420 in FIG. 4, the multiplexers are either not needed, or may be used for a function not required specifically by the other circuitry shown in FIG. 4.

A phase incrementer signal is received on line 622 by summing junction 620. Each clock cycle, the phase incrementer signal on line 622 is added to a running total provided by storage register or transformer 630. This running total is stored in the storage register 630, reduced by performing the mod $[2\pi]$ function, and provided to sine and cosine generation circuits 640, 620, 644, and 646.

These sine and cosine generation circuits are typically lookup tables whose entries are phased shifted relative to one another. In this specific example, there are four sine and cosine generation circuits, where the lookup table entries are shifted relative to each other. Specifically, if a sine wave is represented by values in 4N entries, the sine and cosine generation circuit 640 stores the entries 4n, where n=0 to N−1, sine and cosine generation circuit 642 stores entries 4n+1, sine and cosine generation circuit 644 stores entries 4n+2, while sine and cosine generation circuit 646 stores entries 4n+3. As a simple example, if 8 entries are used to describe a sinewave, and four sine and cosine generators are used, the first may have values 0 and 4 in entries or storage locations 0 and 1, while the second may have values 1 and 5 in its two entries 0 and 1. Similarly, the third may have values 2 and 6 in its two entries, while the fourth has values 3 and 7 in its two. Typically however, there are far more than 8 entries used. For example, there may be 1024 entries used to define a sinewave.

A sine signal on line 652 is generated by sampling the sine signals provided by the lookup tables 640 through 646 on successive high-speed clock cycles. This technique is similar to interpolation since points are filled in between two data values of a given sine and cosine generator by the other sine and cosine generators. Therefore, these points appear as interpolated values when referenced to the given sine and cosine generator. The multiplexer 650 is clocked at a rate that is higher than the clock rate for the phase incrementer and sine and cosine generation circuits by a factor that is equal to the number of inputs to the multiplexer 650.

In other embodiments of the present invention, there may be a different number of sine and cosine generation circuits. Accordingly, the multiplexers 650 and 660 may have a different number of inputs and their clock signals may run at a different relative speed. For example, there may be eight sine and cosine generation circuits, where the output multiplexers 650 and 660 are clocked at eight times the rate of the phase incrementer and sine and cosine generation circuits.

In this way, very high-speed sine and cosine outputs are generated. Only the multiplexers 650 through 660 are required to operate at the highest speed, whereas the phase incrementer circuits and sine and cosine generation circuits are clocked at the lower clock speed.

In embodiments of the present invention where the sine and cosine circuits 640 through 646 are able to generate signals at a sufficient clock rate, multiplexers 650 through 660 are not required, and one sine and cosine generator may be used directly. If a sine and cosine generator provides the NCO outputs directly, it is clocked at the higher rate.

Again, this circuit may be used as the NCO 420 in FIG. 4. In this case, the multiplexers 650 and 660 are not required, and may be omitted, or used for a function not specifically required by the circuitry shown in FIG. 4. When used as NCO 420, the outputs SP0-SP3 and CP0-CP3 of the sine and cosine generators on lines 672-679 are used as the NCO outputs directly.

It will be appreciated by one skilled in the art that even other modifications may be made to this circuit without departing from embodiments of the present invention. For example, the outputs of the sine and cosine generation circuits 640, 642, 644, and 646 may be serialized. Such serializers may include input retiming registers. This configuration provides very high speed NCOs.

Figure 7:
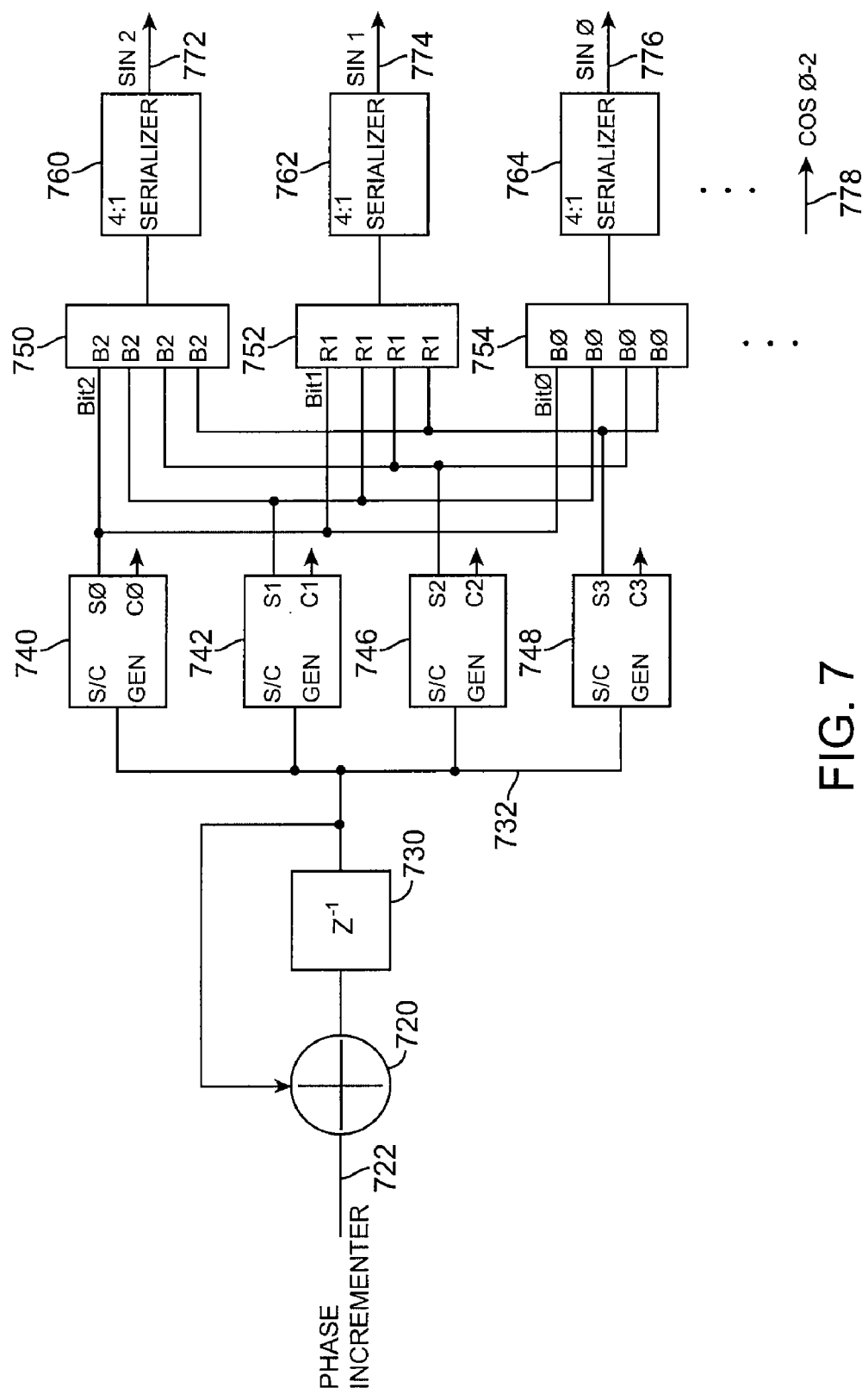
FIG. 7 is a block diagram of an NCO utilizing high speed serializers consistent with an embodiment of the present invention.

FIG. 7 is a schematic of an NCO including high speed serializer outputs consistent with an embodiment of the present invention. This NCO includes adder 720, transformer 730, sine and cosine generators or lookup tables 740, 742, 744, and 746, registers 750, 752, and 754, and serializers 760, 762, and 764. Other registers and serializers may be used to generate a serialized cosine output on lines 778, but are omitted here for clarity. The configuration of those circuits is the same or similar as the configuration for the registers and serializers that generate the serialized sine signals on line 772, 774, and 776.

As before, a phase incrementer signal is received on line 722 by summing junction 720. Each clock cycle, the phase incrementer signal on line 722 is added to a running total provided by transformer 730, which may be implemented by a register or other delay circuit. This running total is stored, reduced by performing the mod $[2\pi]$ function, and provided to sine and cosine generation circuits 740, 720, 744, and 746.

Again, these sine cosine generation circuits are typically lookup tables whose entries are phased shifted relative to one another. In this specific example, there are four sine and cosine generation circuits, where the lookup table entries are shifted relative to each other. Specifically, if a sine wave is represented by 4N entries, the sine and cosine generation circuit 640 stores the entries 4n, where n=0 to N−1, sine and cosine generation circuit 642 stores entries 4n+1, sine and cosine generation circuit 644 stores entries 4n+2, while sine and cosine generation circuit 646 stores entries 4n+3.

The outputs of the sine and cosine generators are stored in register banks 750, 752, and 754 on a per-bit basis. Specifically, the MSBS from each of the words out of the generators are stored in register bank 750, while the LSBS are stored in register banks 754. The output of these register banks are serialized by serializers 760, 762, and 764. The serializers receive slower speed data from the register banks in parallel and convert them to higher speed serial data on output lines 772, 724, and 726. The outputs of the serializers can then drive the mixers 440 as shown in FIG. 4. Again, other serializers that are not shown for simplicity are configured the same or similarly as serializers 760 and are used to generate high speed serialized cosine outputs on lines 778.

By serializing the outputs of the sine and cosine generators 750, 752, and 754, those circuits can operate at a lower frequency. Specifically, if four sine and cosine generators are used, they may run at one-fourth the serializer output rate. Accordingly, if the serializer outputs are clocked at 80 MHz, as in the above example, the sine and cosine generators are clocked at 20 MHz.

In this specific example, there are four sine and cosine generator circuits, each providing output words of three bits. In other embodiments of the present invention, there may be a different number of sine and cosine generation circuits, and they may provide different word widths. Accordingly, the registers and serializers may have a different number of inputs and their clock signals may run at a different relative speed. For example, there may be eight sine and cosine generation circuits, where the output registers 750 through 754 are clocked at eight times the rate of the phase incrementer and sine and cosine generation circuits.

In this way, very high-speed sine and cosine outputs are generated. Only the registers and serializers operate at the higher speed, whereas the phase incrementer circuits and sine and cosine generation circuits are clocked at the lower clock speed. In some embodiments, the registers 750, 752, and 754 may be omitted or combined with serializers 760, 762, and 764.

Figure 8:
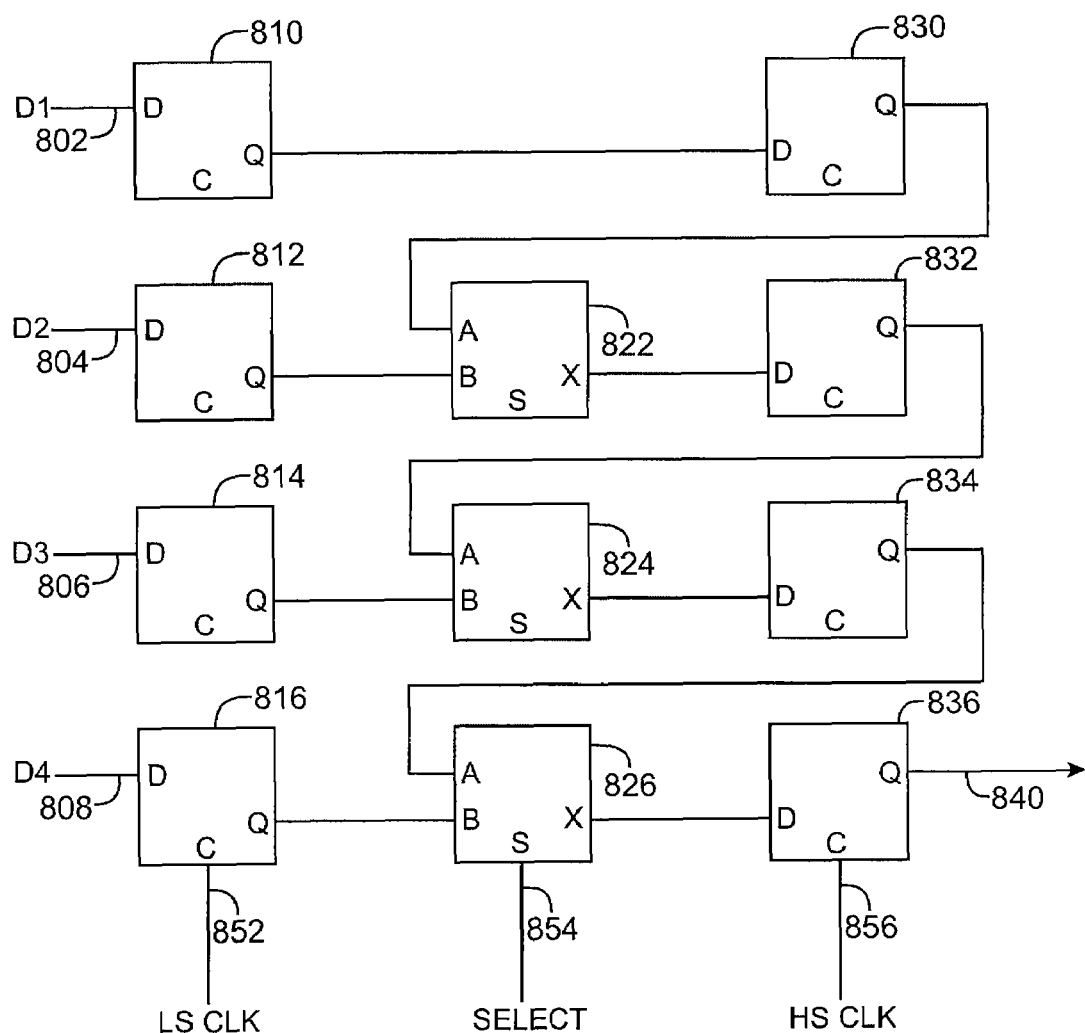
FIG. 8 is a schematic of register and serializer circuits consistent with embodiments of the present invention.

FIG. 8 is a schematic of register and serializer circuits consistent with embodiments of the present invention. Included are parallel registers 810, 812, 814, and 816, multiplexers 822, 824, and 826, and serializing registers 830, 832, 834, and 836. The registers 810 through 816 may be used as a register bank such as the register bank 460 in FIG. 4, or as resister banks in other embodiments of the present invention. The multiplexers 822, 824, and 826 and registers 830 through 836 may be used as a serializer such as the serializer 470 in FIG. 4, or as a serializer in other embodiments of the present invention. These serializers are implemented as dedicated circuitry in programmable logic devices such as the Stratix devices available from Altera Corporation located in San Jose, Calif.

Data is received in parallel on lines D1 802, D2 804, D3 806, and D4 808 by registers 810, 812, 814, and 816. These registers are clocked by a low speed clock on line 852. When the serializer registers are to be loaded, the select line 854 is asserted and data from the Q outputs of registers 810 through 816 are passed through the B inputs of multiplexers 822, 824, and 826 to registers 832, 834, and 836. In this specific example, register 830 is loaded directly by parallel register 810.

A serial data output is provided on line 840. Registers 830 through 836 are clocked by a high speed clock signal on line 856. During each clock cycle, data shifts from one register through its corresponding multiplexer and into the following register. For example, data in register 830 passes through multiplexer 822 into register 832. The output of register 832 passes through multiplexer 824 and into registers 834. Data from register 834 passes through multiplexer 826 and into register 836.

As data ripples from register 832 through 836, new parallel data is provided at inputs D1 802 through D4 808. In this way, low speed data clocked by the low speed clock on line 852 is translated to a high-speed serial data stream Q on line 840, which is clocked by the high-speed clock on lines and 56. In this particular example, the high-speed clock 856 switches at four times the frequency of the low speed clock on line 852. It will be appreciated by one skilled in the art that different numbers of input registers and corresponding multiplexers may be used. For example, and an 8 to 1 serializer may be realized by cascading input registers, output registers, and corresponding multiplexers a total of four more times. This circuit may be described as a parallel bank of registers connected to a shift register.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   an up-converter comprising:
      a first filter having N outputs, where each output provides a signal shifted in phase from one another;
      a second filter having N outputs, where each output provides a signal shifted in phase from one another;
      an oscillator providing 2 times N outputs, where the 2 times N outputs provide N pairs of quadrature signals and where each pair of the quadrature signals are shifted in phase from one another;
      a first plurality of mixers, each mixer receiving one of the N outputs from the first filter and one of the 2 times N outputs from the oscillator;
      a second plurality of mixers, each mixer receiving one of the N outputs from the second filter and one of the 2 times N outputs from the oscillator, wherein an output of each of the first plurality of mixers is combined with an output of the second plurality of mixers; and
      a plurality of parallel-to-serial converters, each parallel-to-serial converter receiving a bit from each of the combined outputs of the mixers and providing a serial output.

2. The integrated circuit of claim 1 wherein each parallel-to-serial converter comprises a plurality of registers coupled as a shift register.

3. The integrated circuit of claim 1 wherein each parallel-to-serial converter comprises a serializer.

4. The integrated circuit of claim 1 wherein the plurality of parallel-to-serial converters are coupled to a digital-to-analog converter.

5. The integrated circuit of claim 1 wherein the oscillator is a numerically controlled oscillator.

6. The integrated circuit of claim 5 wherein the numerically controlled oscillator comprises a plurality of lookup tables, each lookup table comprising a plurality of entries.

7. The integrated circuit of claim 1 wherein the first filter and the second filter are each a multi-tap finite-impulse-response filter.

8. A method of up-converting a signal comprising:
receiving in-phase and quadrature versions of a signal;
decomposing the in-phase version of the signal into a first plurality of signals, each phase shifted from each other;
decomposing the quadrature version of the signal into a second plurality of signals, each phase shifted from each other;
multiplying each of the first plurality of signals with a corresponding one of a third plurality of signals to generate a fourth plurality of signals;
multiplying each of the second plurality of signals with a corresponding of a fifth plurality of signals to generate a sixth plurality of signals;
adding each of the fourth plurality of signals with a corresponding one of the sixth plurality of signals to generate a seventh plurality of signals;
serializing a plurality of most significant bits of the seventh plurality of signals to generate an eighth signal; and
serializing a plurality of least significant bits of the seventh plurality of signals to generate a ninth signal.

9. The method of claim 8 wherein the serializing of the plurality of most significant bits of the seventh plurality of signals is done by a serializer circuit.

10. The method of claim 9 wherein the serializer circuit comprises a plurality of registers configured as a shift register.

11. The method of claim 9 wherein the third and fifth plurality of signals are generated by a numerically controlled oscillator.

12. The method of claim 11 wherein the numerically controlled oscillator comprises a plurality of lookup tables.

13. The method of claim 9 wherein each of the third plurality of signals is approximately in quadrature with one of the fifth plurality of signals.

14. The method of claim 8 further comprising:
converting the eighth signal to an analog signal;
filtering the analog signal; and
applying the filtered analog signal to an antenna.

15. The method of claim 8 further comprising:
serializing a plurality of intermediate bits of the seventh plurality of signals to generate a tenth signal.

16. An integrated circuit including an up-converter comprising:
a first polyphase filter having a first plurality of outputs providing a first plurality of output signals, where each of the first plurality of output signals are shifted in phase from one another;
a second polyphase filter having a second plurality of outputs providing a second plurality of output signals, where each of the second plurality of output signals are shifted in phase from one another;
an oscillator having a third plurality of outputs providing a third plurality of output signals, where each of the third plurality of output signals are shifted in phase from one another, the oscillator further having a fourth plurality of outputs providing a fourth plurality of output signals, where each of the fourth plurality of output signals are shifted in phase from one another, and where each of the fourth plurality of output signals are in quadrature with a corresponding one of the third plurality of output signals;
a first plurality of mixers, each of the first plurality of mixers coupled to one of the first plurality of outputs from the first polyphase filter and one of the third plurality of outputs from the oscillator;
a second plurality of mixers, each of the second plurality of mixers coupled to one of the second plurality of outputs from the second polyphase filter and one of the fourth plurality of outputs from the oscillator;
a plurality of adders, each coupled to an output of one of the first plurality of mixers and an output from one of the second plurality of mixers; and
a plurality of parallel-to-serial converters, each parallel-to-serial converter coupled to an output of each of the plurality of adders.

17. The integrated circuit of claim 16 wherein the parallel-to-serial converter comprises a plurality of registers coupled as a shift register.

18. The integrated circuit of claim 16 wherein the plurality of parallel-to-serial converters are coupled to a digital-to-analog converter.

19. The integrated circuit of claim 16 wherein the oscillator is a numerically controlled oscillator.

20. The integrated circuit of claim 19 wherein the numerically controlled oscillator comprises a plurality of lookup tables, each lookup table comprising a plurality of entries.

21. The integrated circuit of claim 16 wherein the first polyphase filter and the second polyphase filter each comprise a multi-tap finite-impulse-response filter.

* * * * *

UNITED STATES PATENT AND TRADEMARK OFFICE
CERTIFICATE OF CORRECTION

| | | |
|---|---|---|
| PATENT NO. | : 7,406,134 B1 | Page 1 of 1 |
| APPLICATION NO. | : 10/795189 | |
| DATED | : July 29, 2008 | |
| INVENTOR(S) | : Ben Esposito | |

It is certified that error appears in the above-identified patent and that said Letters Patent is hereby corrected as shown below:

In claim 8, column 9, line 15, please insert --one-- after the word "corresponding" and before the word "of."

Signed and Sealed this

Eighth Day of June, 2010

David J. Kappos
*Director of the United States Patent and Trademark Office*